United States Patent
Wang et al.

[11] Patent Number: 5,994,213
[45] Date of Patent: Nov. 30, 1999

[54] ALUMINUM PLUG PROCESS

[75] Inventors: Je Wang; Ji-Chung Huang; Han-Chung Chen; Chung-En Hsu, all of Hsin-Chu, Taiwan

[73] Assignee: Taiwan Semiconductor Manufacturing Company, Ltd., Hsin-Chu, Taiwan

[21] Appl. No.: 09/020,499

[22] Filed: Feb. 9, 1998

[51] Int. Cl.$^6$ .......................... H01L 21/4763; H01L 21/29
[52] U.S. Cl. .......................... 438/622; 438/629; 438/646; 257/751; 257/758; 204/192.25
[58] Field of Search ................................ 438/632, 643, 438/645, 621, 623, 627, 646; 204/192.25; 257/751

[56] References Cited

U.S. PATENT DOCUMENTS

| | | | |
|---|---|---|---|
| 4,756,810 | 7/1988 | Lamont, Jr. et al. | 204/192.3 |
| 5,071,791 | 12/1991 | Inoue et al. | 437/203 |
| 5,171,412 | 12/1992 | Talieh et al. | 204/192.15 |
| 5,288,665 | 2/1994 | Nulman | 437/194 |
| 5,356,836 | 10/1994 | Chen et al. | 437/194 |
| 5,472,912 | 12/1995 | Miller | 438/643 |
| 5,512,512 | 4/1996 | Isobe | 437/187 |
| 5,585,308 | 12/1996 | Sardella | 438/645 |
| 5,763,322 | 6/1998 | Hagen et al. | 438/632 |
| 5,847,463 | 12/1998 | Trivedi et al. | 257/751 |

OTHER PUBLICATIONS

Craig R. Barrett et al., The Principles of Engineering Materials, Prentice Hall, pp. 35, 540, Dec. 31, 1973.
"A Novel High Pressure Low Temperature Aluminum Plug Technology For Sub–0.5μm Contact/Via Geometries", Dixit et al. IEDM 1994, pp. 5.3.1–5.3.4.
"A Novel 0.25μm Via Plug Process Using Low Temperature CVD Al/TiN", Dixit et al. IEDM 1995, pp. 10.7.1–10.7.3.

*Primary Examiner*—Wael Fahmy
*Assistant Examiner*—William David Coleman
*Attorney, Agent, or Firm*—George O. Saile; Stephen B. Ackerman; Rosemary L. S. Pike

[57] ABSTRACT

A new method of aluminum plug metallization in the manufacture of an integrated circuit device is described. An insulating layer is provided over the surface of a semiconductor substrate. At least one contact opening is provided through the insulating layer to the semiconductor substrate. A barrier metal layer is deposited over the surface of the insulating layer and within the contact opening. An aluminum layer is sputter deposited over the barrier metal layer and within the contact opening wherein a void is left within the contact opening. The aluminum layer is covered with a dielectric layer wherein the expansion coefficient of the dielectric layer is smaller than the expansion coefficient of the aluminum layer. The aluminum layer is reflowed using rapid thermal annealing wherein the overlying dielectric layer forces the aluminum layer to fill the contact opening completing the metallization in the fabrication of an integrated circuit device.

30 Claims, 5 Drawing Sheets

5,994,213

ALUMINUM PLUG PROCESS

BACKGROUND OF THE INVENTION

(1) Field of the Invention

The invention relates to a method of metallization of an integrated circuit device, and more particularly, to an aluminum plug metallization method having low cost, low resistance, and few process steps in the manufacture of an integrated circuit device.

(2) Description of the Prior Art

In the fabrication of integrated circuit devices, metal layers make contact to lower conductive layers of the integrated circuit through vias in an insulating layer. Aluminum or an aluminum alloy is often used as the interconnection metal. However, the sputtering process used to apply the aluminum often results in incomplete filling of the via openings due to poor step coverage. Large aluminum grains tend to form on the surface of the insulating layer within the via openings, causing voids. The metal film cannot be melted using rapid thermal annealing (RTA) or furnace methods because of pollution problems. That is, the metal film will flow and become uncontrollable. It will adhere to the walls of the annealing chamber and cause pollution problems. The traditional hot aluminum sputtering method cannot control the grain size of the aluminum, causing metal line formation problems.

Various methods have been proposed to improve aluminum via filling. U.S. Pat. Nos. 5,356,836 to Chen et al, 5,288,665 to Nulman, and 5,171,412 to Talieh et al teach deposition of aluminum in stages at different temperatures. U.S. Pat. No. 5,512,512 to Isobe teaches reflow of the aluminum and U.S. Pat. No. 5,071,791 to Inoue et al teaches heating the wafer while depositing the aluminum. U.S. Pat. No. 4,756,810 to Lamont, Jr. et al discloses radio frequency (RF) excitation to mobilize deposited aluminum to fill holes. In the paper, "A Novel High Pressure Low Temperature Aluminum Plug Technology For Sub-0.5 $\mu$m Contact/Via Geometries," by Dixit et al, *IEDM* 1994, pp. 5.3.1–5.3.4, the authors disclose a method of pressurizing a chamber with Argon to force previously deposited AlCu into via holes. The paper, "A Novel 0.25 $\mu$m Via Plug Process Using Low Temperature CVD Al/TiN" by Dixit et al, *IEDM* 1995, pp. 10.7.1–10.7.3 discloses copper doping an aluminum plug by depositing an overlayer of AlCu.

SUMMARY OF THE INVENTION

A principal object of the present invention is to provide an effective and very manufacturable method of metallization which prevents the formation of voids in the manufacture of an integrated circuit device.

Another object of the invention is to provide a method of metallization having lower cost, lower resistance, and fewer process steps than a conventional tungsten plug process.

Yet another object of the present invention is to provide a method of aluminum plug metallization with improved step coverage.

A further object of the present invention is to provide a method of aluminum plug metallization which prevents the formation of voids.

A still further object of the invention is to provide a method of aluminum plug metallization in which metal grain size can be controlled.

In accordance with the objects of this invention a new method of aluminum plug metallization in the manufacture of an integrated circuit device is achieved. An insulating layer is provided over the surface of a semiconductor substrate. At least one contact opening is provided through the insulating layer to the semiconductor substrate. A barrier metal layer is deposited over the surface of the insulating layer and within the contact opening. An aluminum layer is sputter deposited over the barrier metal layer and within the contact opening wherein a void is left within the contact opening. The aluminum layer is covered with a dielectric layer wherein the expansion coefficient of the dielectric layer is smaller than the expansion coefficient of the aluminum layer. The aluminum layer is reflowed using rapid thermal annealing wherein the overlying dielectric layer forces the aluminum layer to fill the contact opening completing the metallization in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The aluminum plug metallization process of the present invention can be used as the first level metallization to contact source and drain regions and gate electrodes in and on a semiconductor substrate, as shown in FIGS. 1–6. The process of the invention can be used also to connect first and second level metal lines, second and third level metal lines, and so on, as shown in FIGS. 7–10. It should be understood that the process of the invention is not limited to the embodiment illustrated in FIGS. 1–6 wherein a first level metallization is formed, but is equally applicable to higher level metallization.

Figure 1:
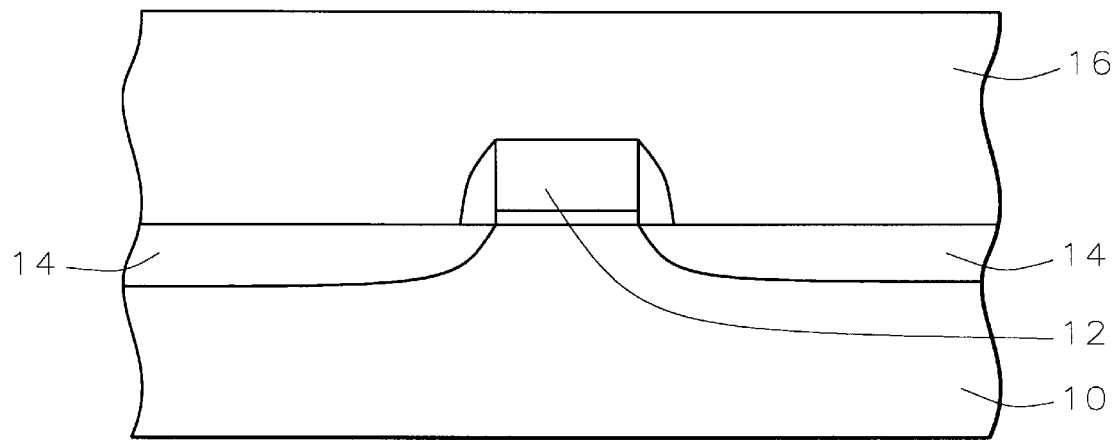
FIGS. 1 through 6 schematically illustrate in cross-sectional representation a preferred embodiment of the present invention for first level metallization.

Referring now to FIG. 1, there is shown a portion of a partially completed integrated circuit device. The semiconductor substrate 10 is preferably composed of monocrystalline silicon. Semiconductor device structures have been formed in and on the semiconductor substrate, including gate electrode 12 and source and drain regions 14. An insulating layer 16, typically composed of TEOS oxide, borophosphosilicate glass (BPSG), or the like, is deposited over the semiconductor device structures to a thickness of between about 4000 to 10,000 Angstroms.

Figure 2:
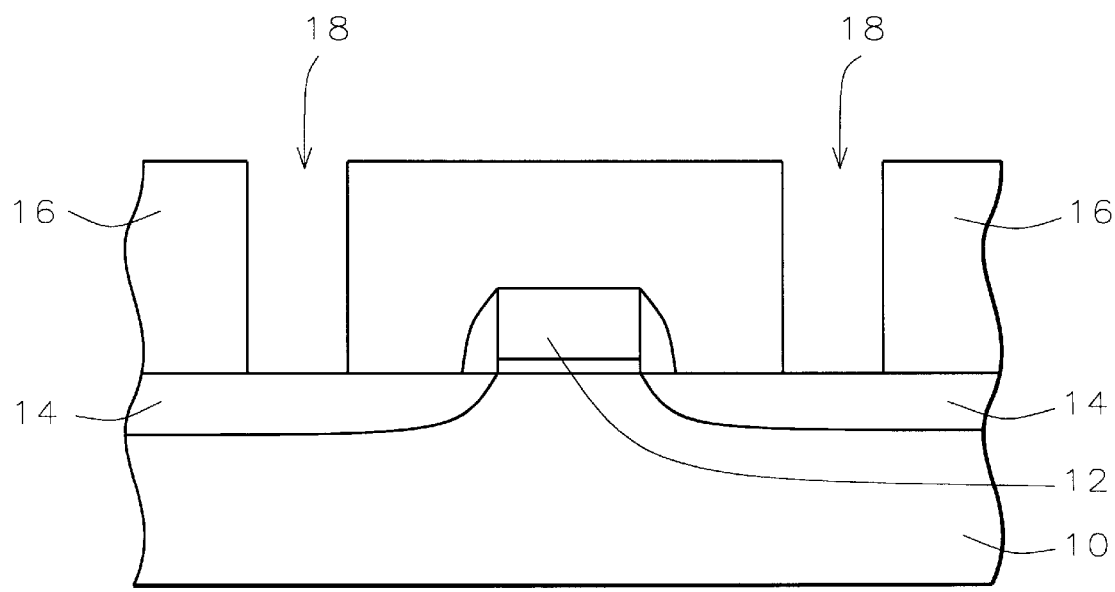

Using conventional lithography and etching techniques, contact openings 18 are formed through the insulating layer 16 to the semiconductor device structures to be contacted, such as source and drain regions 14, as illustrated in FIG. 2.

Figure 3:
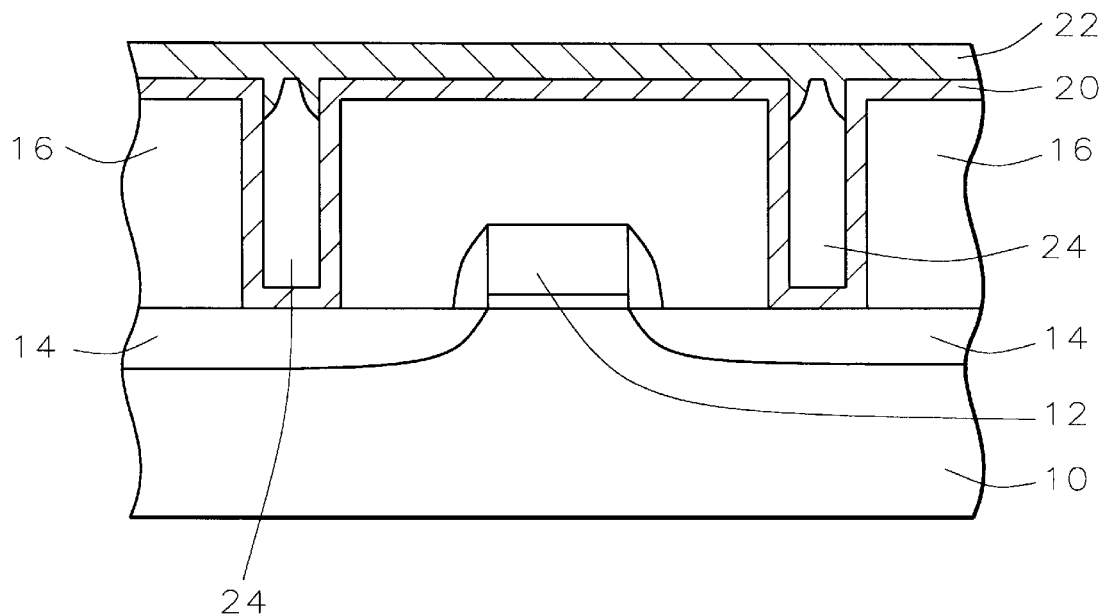

Referring now to FIG. 3, a barrier metal layer 20 is sputtered over the surface of the substrate and within the contact openings. The barrier metal layer is typically a bi-layer of titanium and titanium nitride (Ti/TiN), wherein the titanium layer has a thickness of between about 400 and 800 Angstroms and the titanium nitride layer has a thickness of between about 1000 and 1500 Angstroms.

The aluminum layer 22 is now sputter deposited over the barrier metal layer to a thickness of between about 4000 and 10,000 Angstroms. This layer 22 may be aluminum or an aluminum alloy, such as AlCu or AlSiCu. Voids 24 are left within the contact openings because of poor step coverage of the aluminum within the small openings.

Figure 4:
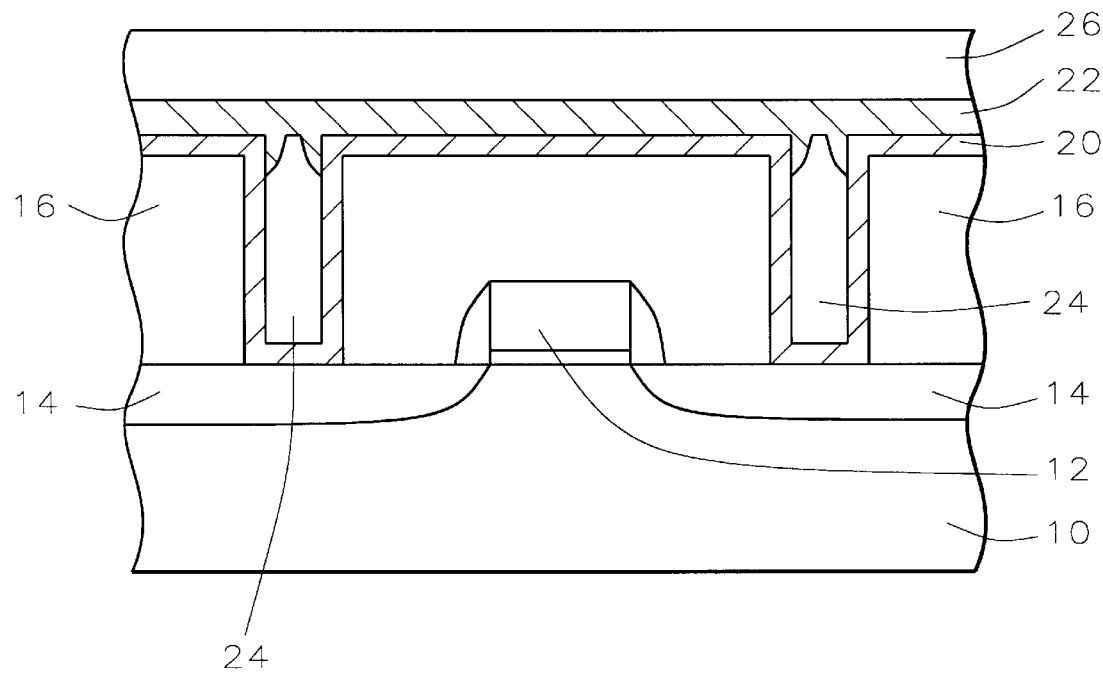

Referring now to FIG. 4, the key features of the present invention will be described. A layer of oxide 26, such as plasma enhanced silicon oxide or borophosphotetraethoxysilane (BPTEOS), is deposited over the aluminum layer 22 to a thickness of between about 3000 to 7000 Angstroms, completely covering the aluminum material. Other oxide materials or other dielectric materials such as silicon nitride could be used as layer 26, so long as the expansion coefficient of the dielectric material is smaller than the expansion coefficient of the aluminum material.

Figure 5:
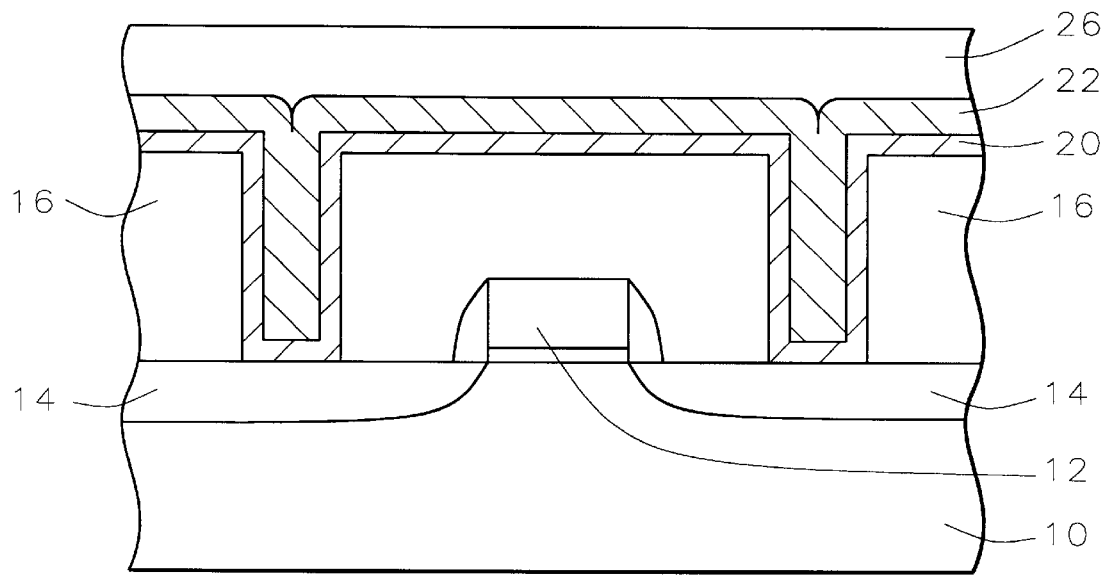

Now, referring to FIG. 5, a rapid thermal annealing (RTA) is performed at a temperature of above about 700° C. to flow the aluminum material. This temperature is above the melting point of the aluminum material (for example, the melting point of AlCu is about 577° C.), so the metal will be reflowed. Since the expansion coefficient of the aluminum material 22 is higher than that of the overlying oxide 26, a top force from the oxide will press down the flowing aluminum into the contact holes, completely filling the holes and eliminating the voids. Since the oxide layer 26 completely covers the aluminum layer, there will be no contamination when the metal flows.

The process of the invention also allows for control of the metal grain size. Grain size is correlated to the temperature cool-down rate. The temperature ramp up/down controllability in RTA is much better than in a sputter chamber; therefore, the aluminum grain size can be obtained as desired.

Figure 6:
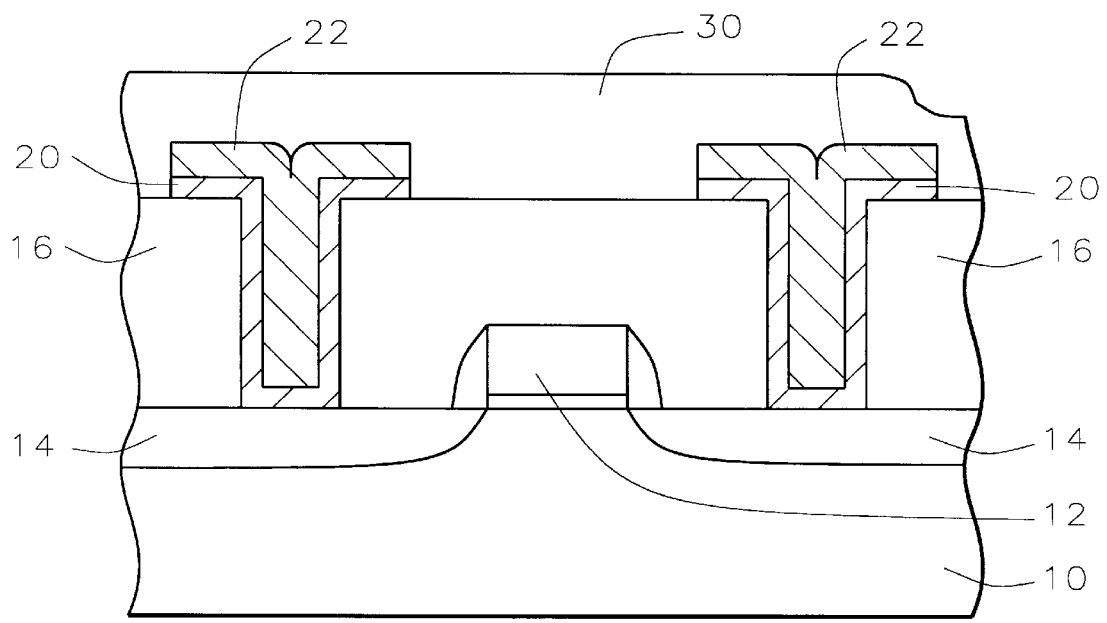
Figure 7:
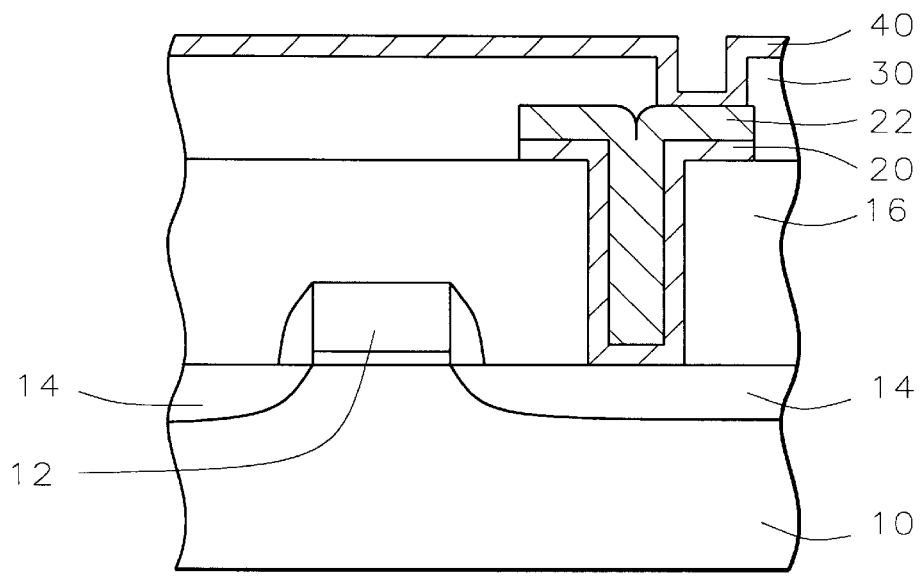
FIGS. 7 through 10 schematically illustrate in cross-sectional representation a preferred embodiment of the present invention for higher level metallization.

Referring now to FIG. 6, the oxide layer 26 is removed and the aluminum layer 22 is patterned as desired to form the metal lines. Dielectric layer 30 serves as a passivation layer or as an interlevel dielectric layer if further metallization is to be fabricated.

FIGS. 7–10 illustrate the process of the present invention for higher level metallization. For example, a contact opening is etched through the interlevel dielectric layer 30 to contact the underlying metal line 22. A barrier metal layer 40 is deposited over the interlevel dielectric layer 30 and within the contact opening.

Figure 8:
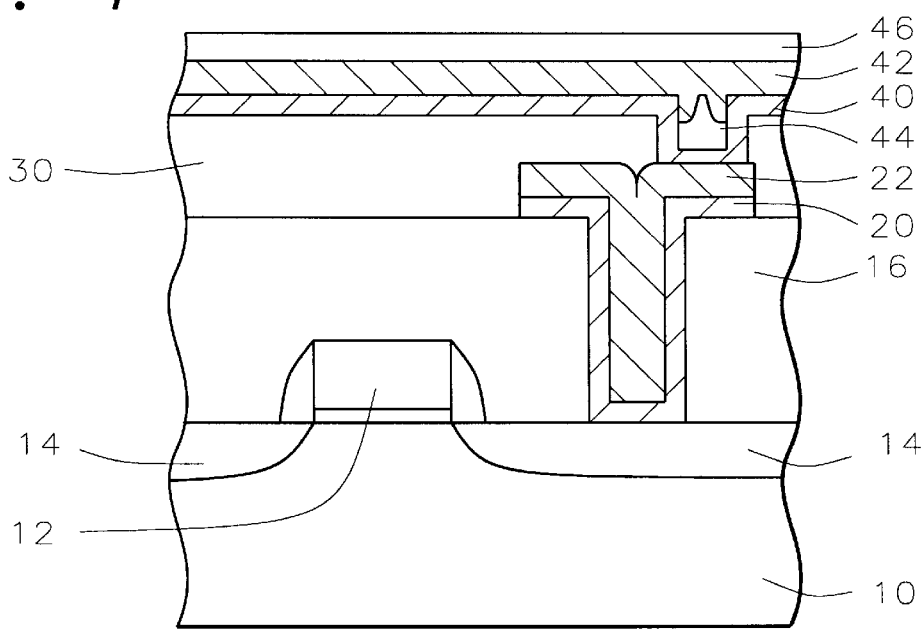
Figure 9:
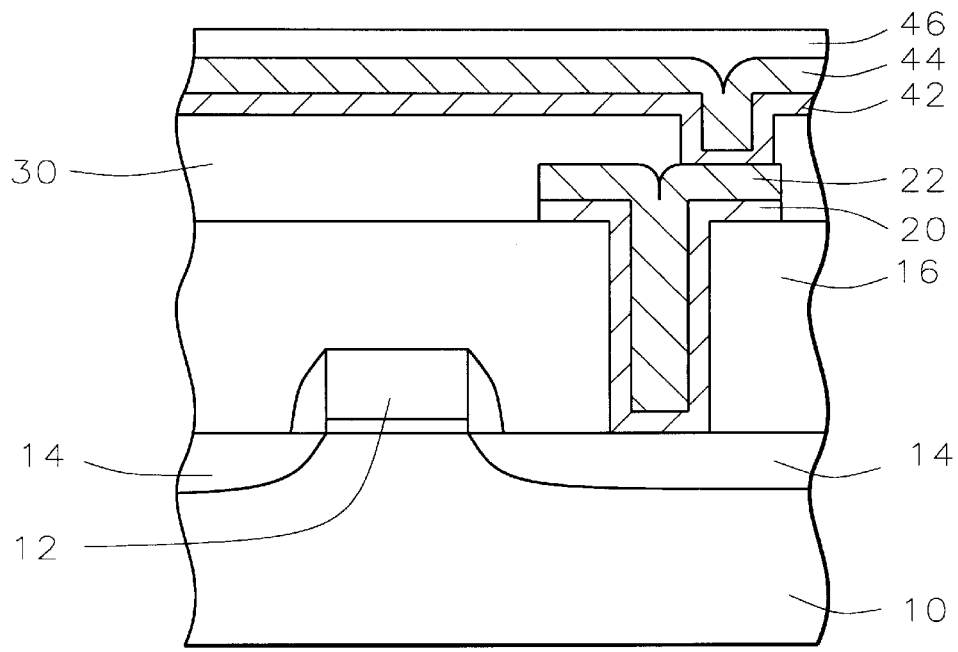
Figure 10:
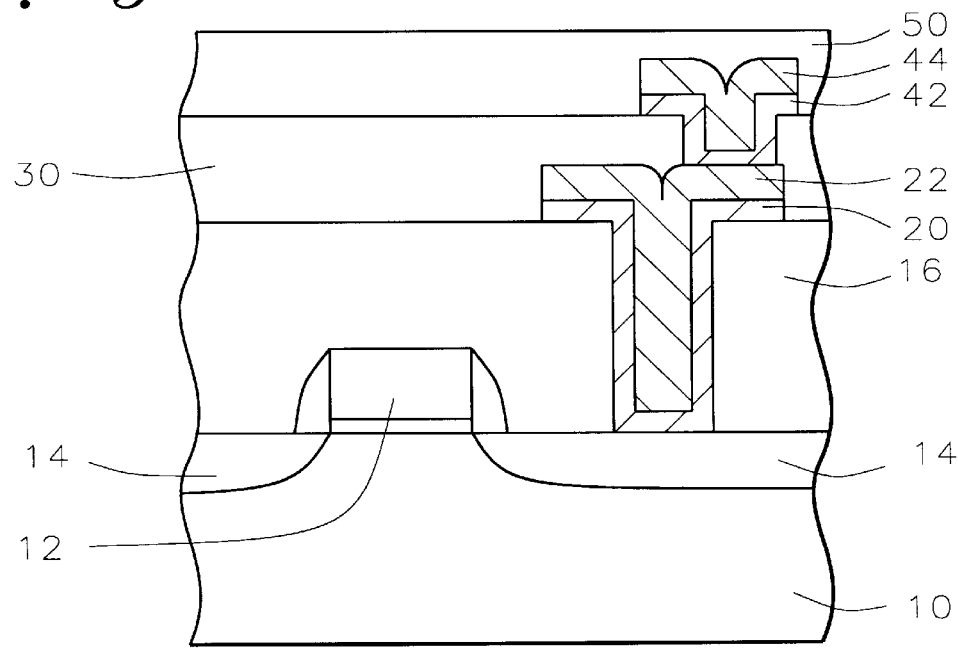

Referring to FIG. 8, aluminum material layer 42 is sputter deposited over the barrier metal layer 40, leaving voids 44, as discussed above with reference to FIG. 3. Dielectric layer 46 is deposited over the aluminum material layer 42. As above, the expansion coefficient of the dielectric material must be smaller than the expansion coefficient of the aluminum material. This is illustrated in FIG. 8. FIG. 9 illustrates the filling of the void 44 by the aluminum layer 42 after the RTA of the present invention, described above. The dielectric layer 46 is removed, the metal line 42 is patterned, and passivation layer 50 is deposited, as illustrated in FIG. 10.

The metallization process of the present invention can be used for all levels of metallization and results in a good step coverage filling of contact openings, even those with high aspect ratios, with the absence of voids. As compared with a tungsten plug process, the aluminum plug process has a lower cost, fewer overall process steps, and results in a contact having lower resistance. In addition, since the grain size of the aluminum can be controlled as desired, the quality of the resulting metal lines is improved.

While the invention has been particularly shown and described with reference to the preferred embodiments thereof, it will be understood by those skilled in the art that various changes in form and details may be made without departing from the spirit and scope of the invention.

What is claimed is:

1. A method of metallization in the fabrication of an integrated circuit device comprising:

providing an insulating layer over the surface of a semiconductor substrate;

providing at least one contact opening through said insulating layer to said semiconductor substrate;

depositing a barrier metal layer over the surface of said insulating layer and within said contact opening;

sputter depositing an aluminum layer over said barrier metal layer and within said contact opening wherein a void is left underlying said aluminum layer within said contact opening;

covering said aluminum layer with a dielectric layer wherein the expansion coefficient of said dielectric layer is smaller than the expansion coefficient of said aluminum layer; and reflowing said aluminum layer using rapid thermal annealing wherein said overlying dielectric layer forces said aluminum layer to fill said void within said contact opening completing said metallization in the fabrication of said integrated circuit device.

2. The method according to claim 1 wherein said barrier metal layer comprises titanium and titanium nitride.

3. The method according to claim 1 wherein said aluminum layer comprises pure aluminum having a thickness of between about 4000 and 10,000 Angstroms.

4. The method according to claim 1 wherein said aluminum layer comprises a AlCu alloy having a thickness of between about 4000 and 10,000 Angstroms.

5. The method according to claim 1 wherein said aluminum layer comprises a AlSiCu alloy having a thickness of between about 4000 and 10,000 Angstroms.

6. The method according to claim 1 wherein said dielectric layer has a thickness of between about 3000 and 7000 Angstroms.

7. The method according to claim 1 wherein said dielectric layer is an oxide layer.

8. The method according to claim 1 wherein said dielectric layer comprises silicon nitride.

9. The method according to claim 1 wherein said rapid thermal annealing is performed at more than about 700° C.

10. A method of aluminum plug metallization in the fabrication of an integrated circuit device comprising:

providing semiconductor device structures in and on a semiconductor substrate;

depositing an insulating layer overlying said semiconductor device structures;

providing at least one contact opening through said insulating layer to one of said semiconductor device structures;

depositing a barrier metal layer over the surface of said insulating layer and within said contact opening;

sputter depositing an aluminum layer over said barrier metal layer and within said contact opening wherein a void is left underlying said aluminum layer within said contact opening;

covering said aluminum layer with a dielectric layer wherein the expansion coefficient of said dielectric layer is smaller than the expansion coefficient of said aluminum layer;

reflowing said aluminum layer using rapid thermal annealing wherein said overlying dielectric layer forces said aluminum layer to fill said void within said contact opening;

thereafter removing said dielectric layer; and patterning said aluminum layer to complete said aluminum plug metallization in the fabrication of said integrated circuit device.

11. The method according to claim 10 wherein said semiconductor device structures include gate electrodes and source and drain regions and wherein said at least one semiconductor device structure to be contacted is one of said source and drain regions.

12. The method according to claim 10 wherein said semiconductor device structures include gate electrodes and source and drain regions, an overlying first insulating layer, and overlying metal lines and wherein said at least one semiconductor device structure to be contacted is one of said metal lines.

13. The method according to claim 10 wherein said barrier metal layer comprises titanium and titanium nitride.

14. The method according to claim 10 wherein said aluminum layer comprises pure aluminum having a thickness of between about 4000 and 10,000 Angstroms.

15. The method according to claim 10 wherein said aluminum layer comprises a AlCu alloy having a thickness of between about 4000 and 10,000 Angstroms.

16. The method according to claim 10 wherein said aluminum layer comprises a AlSiCu alloy having a thickness of between about 4000 and 10,000 Angstroms.

17. The method according to claim 10 wherein said dielectric layer has a thickness of between about 3000 and 7000 Angstroms.

18. The method according to claim 10 wherein said dielectric layer is an oxide layer.

19. The method according to claim 10 wherein said dielectric layer comprises silicon nitride.

20. The method according to claim 10 wherein said rapid thermal annealing is performed at more than about 700° C.

21. A method of aluminum plug metallization in the fabrication of an integrated circuit device comprising:

providing semiconductor device structures in and on a semiconductor substrate;

depositing an insulating layer overlying said semiconductor device structures;

providing at least one contact opening through said insulating layer to one of said semiconductor device structures;

sputter depositing an aluminum layer over said insulating layer and within said contact opening wherein a void is left underlying said aluminum layer within said contact opening;

covering said aluminum layer with an oxide layer wherein the expansion coefficient of said oxide layer is smaller than the expansion coefficient of said aluminum layer;

reflowing said aluminum layer using rapid thermal annealing wherein said overlying oxide layer forces said aluminum layer to fill said void within said contact opening;

thereafter removing said oxide layer; and patterning said aluminum layer to complete said aluminum plug metallization in the fabrication of said integrated circuit device.

22. The method according to claim 21 wherein said semiconductor device structures include gate electrodes and source and drain regions and wherein said at least one semiconductor device structure to be contacted is one of said source and drain regions.

23. The method according to claim 21 wherein said semiconductor device structures include gate electrodes and source and drain regions, an overlying first insulating layer, and overlying metal lines and wherein said at least one semiconductor device structure to be contacted is one of said metal lines.

24. The method according to claim 21 further comprising depositing a barrier metal layer overlying said insulating layer and within said contact opening before said sputter depositing said aluminum layer.

25. The method according to claim 24 wherein said barrier metal layer comprises titanium and titanium nitride.

26. The method according to claim 21 wherein said aluminum layer comprises pure aluminum having a thickness of between about 4000 and 10,000 Angstroms.

27. The method according to claim 21 wherein said aluminum layer comprises a AlCu alloy having a thickness of between about 4000 and 10,000 Angstroms.

28. The method according to claim 21 wherein said aluminum layer comprises a AlSiCu alloy having a thickness of between about 4000 and 10,000 Angstroms.

29. The method according to claim 21 wherein said oxide layer has a thickness of between about 3000 and 7000 Angstroms.

30. The method according to claim 21 wherein said rapid thermal annealing is performed at more than about 700° C.

* * * * *